United States Patent [19]
Spaeth

[11] Patent Number: 5,943,553
[45] Date of Patent: Aug. 24, 1999

[54] APPLYING SEMICONDUCTOR LASER MIRROR LAYERS AFTER SECURING SUPPORT PLATE TO LASER BODY

[75] Inventor: Werner Spaeth, Holzkirchen, Germany

[73] Assignee: Siemens Aktiengesellschaft, Munich, Germany

[21] Appl. No.: 08/723,831

[22] Filed: Sep. 30, 1996

[30] Foreign Application Priority Data

Sep. 29, 1995 [DE] Germany .......................... 195 36 434

[51] Int. Cl.⁶ .................................................. H01S 3/025
[52] U.S. Cl. ............................. 438/29; 372/107; 438/27
[58] Field of Search ................................ 438/26, 29, 46, 438/47, 33, 43, 37, 41, 39; 257/712, 719, 680, 98; 29/580; 372/42, 107, 45

[56] References Cited

U.S. PATENT DOCUMENTS

| | | | |
|---|---|---|---|
| 3,614,550 | 10/1971 | Marinace et al. | 257/415 |
| 3,691,476 | 9/1972 | Hayashi | 313/108 |
| 3,946,334 | 3/1976 | Yonezu et al. | 438/26 |
| 4,032,963 | 6/1977 | Thome . | |
| 4,064,621 | 12/1977 | Lo | 29/569 |
| 4,178,564 | 12/1979 | Ladany et al. . | |
| 4,210,878 | 7/1980 | Yonezu | 29/590 |
| 4,255,755 | 3/1981 | Itoh et al. | 257/279 |
| 4,257,156 | 3/1981 | Houston | 29/580 |
| 4,360,965 | 11/1982 | Fujiwara . | |
| 4,706,106 | 11/1987 | Shiba et al. . | |
| 4,769,684 | 9/1988 | Crocker et al. . | |
| 4,856,015 | 8/1989 | Matsui et al. | 257/712 |
| 4,914,668 | 4/1990 | Nagai et al. | 372/49 |
| 5,087,479 | 2/1992 | McManus et al. . | |
| 5,180,685 | 1/1993 | Yamamoto et al. | 438/33 |
| 5,208,467 | 5/1993 | Yamazaki . | |
| 5,284,792 | 2/1994 | Forster et al. . | |
| 5,571,750 | 11/1996 | Watanabe et al. | 438/33 |

FOREIGN PATENT DOCUMENTS

| | | |
|---|---|---|
| 0 292 029 | 11/1988 | European Pat. Off. . |
| 2 273 438 | 12/1975 | France . |
| 30 19 868 | 11/1980 | Germany . |
| 38 22 432 | 1/1989 | Germany . |
| 43 15 580 | 11/1994 | Germany . |
| 44 10 212 | 9/1995 | Germany . |
| 58-091692 | 5/1983 | Japan . |
| 63-181491 | 7/1988 | Japan . |

*Primary Examiner*—Olik Chaudhuri
*Assistant Examiner*—William David Coleman
*Attorney, Agent, or Firm*—Hill & Simpson

[57] ABSTRACT

A method for manufacturing a semiconductor component having a semiconductor body secured to a support plate comprises securing the support plate on a surface of the semiconductor body before applying the cover layers which form mirrors on the end surfaces of the semiconductor body. The support plate is preferably made of an electrically and thermally conducting material which has a coefficient of thermal expansion similar to the coefficient of thermal expansion of the semiconductor body.

19 Claims, 2 Drawing Sheets

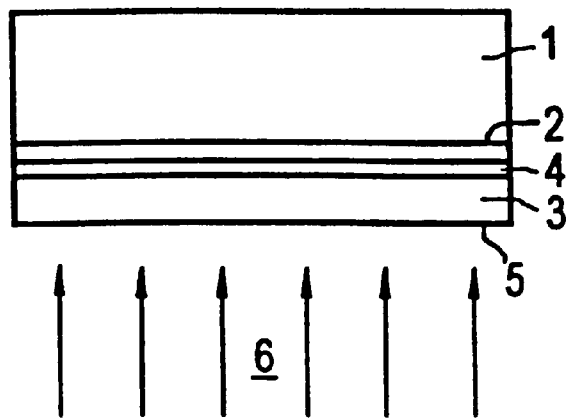
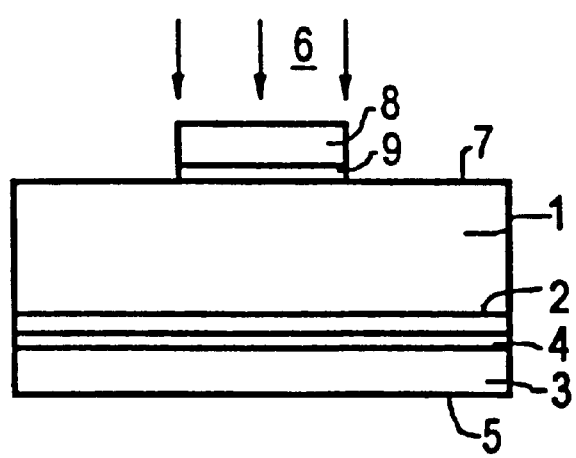
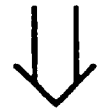
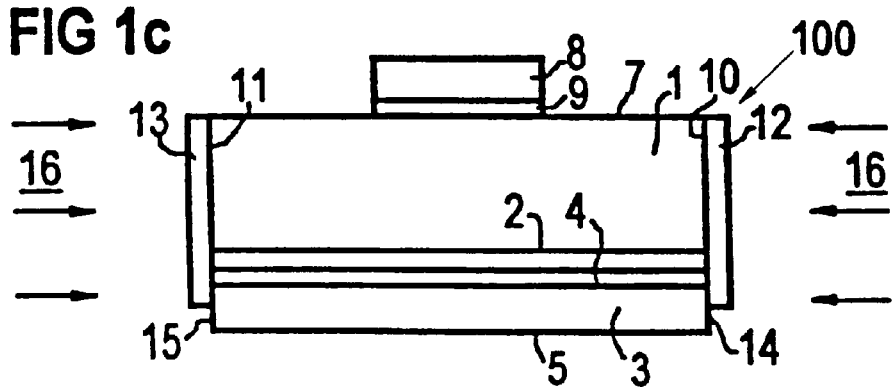

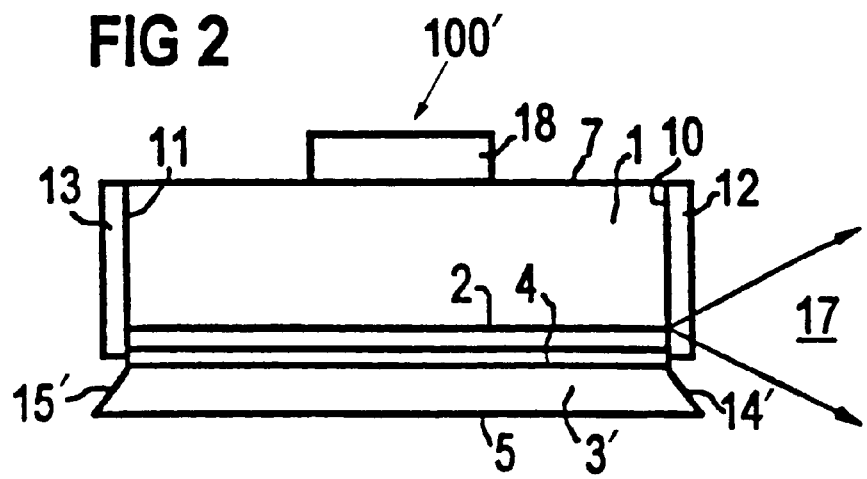
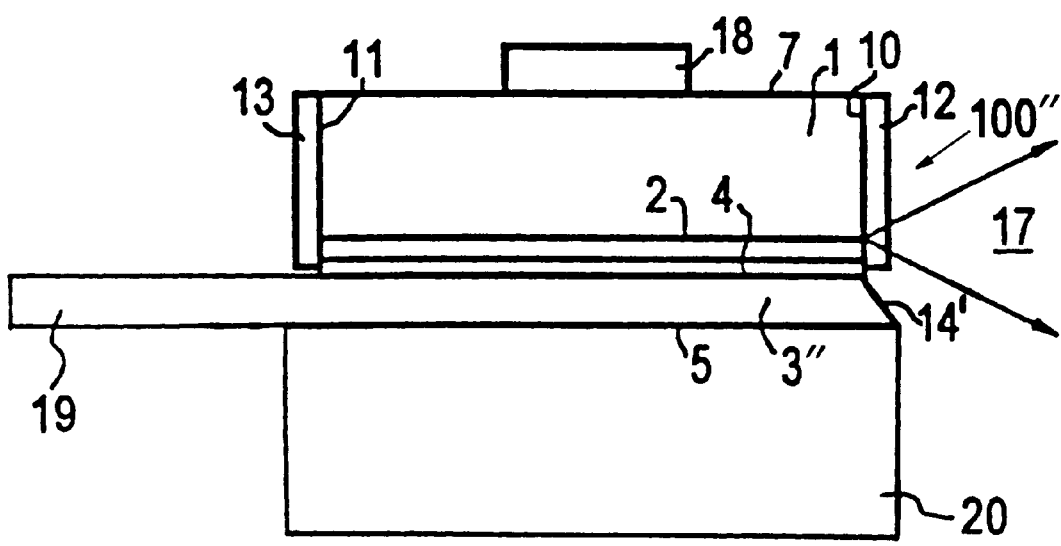

APPLYING SEMICONDUCTOR LASER MIRROR LAYERS AFTER SECURING SUPPORT PLATE TO LASER BODY

BACKGROUND OF THE INVENTION

The present invention is directed to a method for manufacturing a semiconductor component in which a semiconductor body that has a covering layer on at least a partial area of surface of the body is fastened on a support plate.

In order to protect semiconductor laser components, in particular high-power semiconductor laser components from damage due to overheating, these components are often mounted on cooling bodies. These cooling bodies are constructed so that the heat produced in a semiconductor body is rapidly discharged to the environment.

German published Offenlegungsschrift 43 15 580 disclosed an arrangement of a laser diode chips and what is called a microchannel heat sink. During the manufacturing of this arrangement, the laser diode chip is soldered onto a cover plate of a microchannel heat sink (MKWS) after the laser chip has been manufactured. The cover plates consist of several copper sheets. Due to the different thermal coefficients of expansion of the copper and semiconductor material, a plastically deformable soldering material is used.

The connection between the laser diode chip and the cover plate must have as high as possible uniformity over the entire connection area with respect to the thermal, electrical and mechanical properties, so that a homogeneous current and heat transition between the semiconductor body and the base plate can take place. Inhomogeneous thermal and/or electrical characteristics in the laser diode chip lead to inhomogeneous heat and/or current distribution, which for example accelerates aging, and an extreme case can cause the destruction of the laser diode chip.

Meeting the above-named requirements is particularly difficult when, as often is the case for laser diode chips, the surfaces of the semiconductor body are contaminated with a material, so that the solder wets the surface only partially or not at all. In semiconductor bodies of laser diode chips, the surface is mostly contaminated with material for forming the mirrors such as for example, $Al_2O_3$, $SiO_2$, Si, SiC and/or $Si_3N_4$, which materials are deposited immediately after the manufacturing of the semiconductor body, for example on the side or end surfaces thereof. These mirror layers form the optical resonator of the laser. With this procedure, it is almost unavoidable, or, respectively, is possible only with a very large process-oriented expense, to prevent a contamination of the contact surfaces of the semiconductor body. The term "contact surfaces" means those partial areas of the surface of the semiconductor body on which contact plates, for example the base plate, or contact metallizations are to be deposited.

Up to now, this problem is often solved in that the contact surface or surfaces of the semiconductor body are cleaned after applying the mirror coating. However, a cleaning of this type requires an additional procedure or processing step and it also increases a risk of breakage or damage to the semiconductor body. The problem with breakage or damage to the semiconductor body is particularly present for semiconductor bodies made of III–V semiconductor material, such as for example, GaAs, AlGaAs and InAlGaAs.

SUMMARY OF THE INVENTION

The object of the present invention is to develop a method for preparing a semiconductor laser component having a semiconductor body with covering layers on at least a partial area of the surface and a support plate secured to one of the surfaces, which method avoids contamination of the contact surfaces of the semiconductor body with poorly wettable material.

To accomplish these objects, the present invention comprises a method for manufacturing a semiconductor laser component which has a semiconductor body with surfaces, a covering layer disposed on at least a partial area of the surfaces and a support plate secured to one of said surfaces. The method comprises the steps of providing the semiconductor body and the support plate, securing the plate on the one surface of the semiconductor body and then depositing a covering layer on a surface adjacent the one surface.

The method of the present invention provides for the covering layer to be deposited after the fastening of the semiconductor body on the support plate.

In a preferred development of the inventive method, the support plate is made of a material that comprising both a good thermal and good electrical conductivity. This has a particular advantage that the support plate can be used at the same time as an electrical terminal and/or as a thermal terminal.

In an advantageous embodiment of the method, the material of the support plate has a thermal coefficient of expansion similar to that of the semiconductor body. In this way, mechanical stresses in the semiconductor laser component can be reduced.

In a particular preferred embodiment of the method, the covering layer is a mirror layer and the semiconductor body is positioned on the support plate in such a way that at least one side surface of the semiconductor body terminates flush with the side or end surface of the support plate. In this way, a covering layering with a very homogenous thickness can be produced at least on the side surface of the body.

In another preferred development of the inventive method, a mirror layer is deposited on each of the two side or end surfaces of the semiconductor body lying opposite one another. These mirror layers form the resonator of the semiconductor laser component.

An advantageous development of the invention of the method is that the semiconductor body is fastened on a support plate by means of a hard solder. A very stable and long lasting connection can be obtained with hard solder.

In a particularly preferred embodiment of the inventive method, the semiconductor body is positioned on the support plate in such a way that at least the side surfaces of the semiconductor body from which surface a laser beam exits from the semiconductor body, terminate flush with a side surface of the support plate. This contributes advantageously to the minimization of the disturbances of the laser beam after the exit from the semiconductor body.

In an advantageous embodiment of the support plate, at least one frontal surface, preferably the one that is adjacent to a beam exit surface of the semiconductor body is sloped so that it encloses an angle between 90° and 180° with the laser beam exit surface. With this structure, a maximal heat discharge can be advantageous obtained with a simultaneous minimum disturbance of the laser beam after it exits from the semiconductor body.

Furthermore, it is advantageous if the covering layer is constructed so that it overlaps with the support plate. For example, the covering layer can also cover a part of the support plate. This has a particular advantage that, as is a generally known, inhomogeneities occurring particularly in the edge area of the layer will not come to lie on the semiconductor body.

Other advantages and features in the invention will be readily apparent from the following descriptions of the preferred embodiments, the drawings and claims:

BRIEF DESCRIPTION OF THE DRAWINGS

FIGS. 1a–1c are schematic representation of an inventive method with FIG. 1a showing the securing of the support plate on the semiconductor body, with FIG. 1b showing the forming of a contact on an opposite surface, and with FIG. 1c showing applying the cover layers after the support plate and contact have been applied;

FIG. 2 is a schematic representation of a modification of a semiconductor laser component manufactured according to the present method; and FIG. 3 is a schematic representation of another modification of a semiconductor laser component manufactured according to the method of the present invention.

DESCRIPTION OF THE PREFERRED EMBODIMENTS

The principles of the present invention are particularly useful when incorporated in a method for manufacturing a semiconductor laser generally indicated at 100 in FIG. 1C. The laser 100 is a laterally emitting laser diode which has a semiconductor body 1 with a laser-active pn junction 2. The semiconductor body 1 is preferably made of a material such as GaAs, AlGaAs and/or InAlGaAs. The semiconductor body 1 with the laser active pn junction 2 is secured onto a support plate 3. The support plate 3 preferably has a thickness which lies between $20\mu$ and $100\mu$ and is made of molybdenum or of another material that has a coefficient of thermal expansion similar to the material of the semiconductor body, a good thermal conductivity and a good electrical conductivity.

To secure the support plate 3 on the one surface of the semiconductor body 1, a hard solder is used to form a connecting layer or means that extends between the one surface of the body 1 and the support plate 3. An example of a hard solder is a AuSn alloy. However, it would also be possible to use an electrically and thermally conductive adhesive. The connecting means 4 is deposited on the semiconductor body 1 or on the support plate 3 before the plate is fastened on the semiconductor body 1. The depositing is selected from vacuum metallization, sputtering or an immersion in a liquefied connecting means. The layer 4 of the connecting means has a thickness in a range of between 1 $\mu$m and 2 $\mu$m. A possibly required structuring of the connecting means 4 can occur by means of a masking technique or photolithography. For the improvement of the soldering characteristics of the support plate 3 and the semiconductor body 1 and/or the permanence of the solder connective, an electrically conducted bonding agent, for example TiPt-Au layer sequence, a TiPd-Au layer sequence or other suitable materials can be deposited on the support plate 3 and/or on the semiconductor body 1. The Au layer, whose thickness is for example 1 $\mu$m, improves the wetting between the solder and Pt or Pd.

The connecting of the semiconductor body 1 with the support plate 3, for example, can be obtained by means of irradiation of the underside 5 of the plate 3 with a laser radiation shown by the arrows 6 in FIG. 1a and is a laser soldering process which is described herein below. However, one skilled in the art can also use any other soldering process that seems suitable.

For laser soldering, a high-performance semiconductor laser is preferably used. With a laser of this type, the soldering temperature and the duration of the soldering process can be set precisely in a simple manner. In this regard, the small thickness of the support plate 3 has an advantageous effect. Due to the low heat absorption connected with a thin support plate, a desired temperature-time profile can be obtained very precisely. As is well-known, the temperature-time profile is of essential importance for the manufacturing of homogeneous and reproducible soldering joint.

As a next step, a contact plate 8 is deposited on the upper side or surface of the semiconductor body 1 (See FIG. 1b). For example, this plate 8 is made of the same material as the support plate 3, and is likewise fastened by means of laser soldering. As a connecting means 9, a hard solder is again used for example, Au or an AuSn alloy solder.

In place of the contact plate 8, a contact metallization, made for example, of Au, Al, an Au base alloy or an Al base alloy, can be deposited on the semiconductor body 1. If necessary, the contact plate 8, or, respectively, the contact metallization, can cover the entire upper surface 7 of the semiconductor body. Likewise, several contact plates 8 or contact metallizations can be deposited on the upper side 7 of the semiconductor body 1.

Following the fastening of the contact plate or contact 8 on the upper surface 7 of the semiconductor body 1, mirror layers 12 and 13 can be respectively deposited on the end surfaces 10 and 11 of the semiconductor body 1, for example by means of a vacuum metallization or sputtering as illustrated in FIG. 1c. These layers are made of for example $Al_2O_3$ $SiO_2$, Si, SiC and/or $Si_3N_4$, or other suitable materials that are transparent to radiation and will protect the semiconductor surface or semiconductor mirror from oxidation and corrosion. The vacuum metalization process or, respectively, sputtering process is indicated in FIG. 1c by the arrows 16. The two mirror layers 12 and 13 form the optical resonator of the laser diode.

In the laser diode shown in FIG. 1c, the width of the support plate 3 corresponds precisely to the space between the two end surfaces 10 and 11 of the semiconductor body 1 and the two end surface 10 and 11 of the semiconductor body 1 terminate flush with the two end or side surfaces 14 and 15 of the support plate 3. However, this ideal case is not easily reproducible, due to unavoidable process tolerances in the manufacturing of the semiconductor body 1 and of the support plate 3, as well as due to tolerances in the positioning of the semiconductor body 1 on the support plate 3.

With regard to the dimensions of the semiconductor body 1 and the support plate 3, the following minimum conditions must be fulfilled:

a) A projection of the support plate 3 beyond end surfaces 10 and 11 of the semiconductor body 1 must be dimensioned so that no shadowing of the end surfaces 10 or 11 is caused during the application of the mirror coating or layers. An inhomogeneity of the mirror surface would lead to a disturbance of the laser radiation generated in the semiconductor body 1.

b) On the side of the radiation exit surface of the semiconductor body 1, the support plate may project beyond the semiconductor body 1 only so far that the beam is not disturbed by being reflected by the support plate 3. The radiation exit surface is that side surface of the body from which this laser beam exits from the semiconductor body 1.

c) Simultaneous with the two above-mentioned conditions, the support plate 3 must ensure a maximum heat discharge. An effective cross-section of the support plate 1 that is as large as possible should thus be provided.

A semiconductor laser component manufactured according to the above-specified method and in which the effective cross-section of the support plate 3 is enlarged in relation to the semiconductor laser component 100 shown in FIG. 1C, while at the same time fulfilling conditions a) to c) is schematically shown in FIG. 2 and generally indicated at 100'. The difference between the semiconductor component 100' and the component 100 of FIG. 1c is essentially that the side surfaces 14' and 15' of the support plate 3' are adjacent to end surfaces 10 and 11 of the semiconductor body 1 and are provided with a slope or taper. The angle between the side surfaces 14' and 15' and an underside 5 of the plate 3' is for example 45°. The size of the angle is dependent of the diversions of the laser beam 17 exiting from the semiconductor body 1 and can lie between 0° and 90°. Thus, the surface such as 14' forms an angle between 90° and 180° to a end surface 10 of the body 1.

The component 100' has a contact metallization 18 in place of the contact plate 8 of the component 100. The contact metallization 18 is for example, made of aluminum which is deposited on the surface 7 of the semiconductor body 1. The advantage of the sloping end surfaces 14' and 15' of the support plate 3 is among other things an increase in the heat discharge that can be achieved.

In contrast to the above-specified semiconductor laser components 100 and 100', a semiconductor laser component generally indicated at 100" shown schematically in FIG. 3 comprises for example support plate 3" which is fashioned with a terminal lug 19 for an electrical connection of the semiconductor body 1. Thus, support plate 3" can advantageous be used at the time as an electrical terminal. In addition, a heat sink or cooling body 20 is for example connected to the support plate 3 in a thermally conductive manner.

The fact that the material of the support plate 3, 3' and 3" has a coefficient of thermal expansion similar to the coefficient for the semiconductor material of the semiconductor body 1 allows, as already shown in FIG. 1c, the mirror layers 12 and 13 to be deposited in such a way that they cover not only the end surfaces 10 and 11 but also at least partial areas of the end surfaces 14 and 15 of the support plate 3. The manufacturing of the mirror layers 12 and 13 which comprise a uniform thickness at least in the area of the semiconductive pn junction 2 is thereby considerably simplified.

With the use of a support plate material whose coefficient of thermal expansion differ significantly from that of the semiconductor material, such an overlapping of the mirror layer 12 and 13 with the support plate 3 would not be permissible. This is because considerable mechanical stresses would then occur in the mirror layers 12 and 13 upon heating of the semiconductor laser component due to different rates of thermal expansion which stresses in an extreme case would lead to breaking of the mirror layers 12 and 13 and thereby to the destruction of the laser diode.

The inventive method has the further advantage that the removal of impurities on the undersurface or side 5 of the stable support plate 3 is essentially simpler and less critical than the removal of impurities from a surface of the semiconductor body 1. This is because many semiconductor materials, for example GaAs, AlGaAs, and InAlGaAs are extremely sensitive to mechanical stress. Likewise, before sputtering, the semiconductor material can be covered, for example by means of photosensitive resist in order to prevent contamination.

Subsequent to the above-specified method steps, and possible further ones, the semiconductor laser components 100, 100' and 100" shown schematically in FIGS. 1c, 2 and 3 can be mounted in a simple manner on a cooling body. The cooling body may be for example a plate made of diamond, or a microchannel heat sink made of copper, Si or plastic. Cooling bodies of this type are known to one of average skill in the art, and according to the material, can be secured to the support plate 3 by means of adhesive, soldering or welding. For additional cooling, a cooling body can also be attached to the contact plate 8.

Although various minor modifications may be suggested by those versed in the art, it should be understood that I wish to embody within the scope of the patent granted hereon all such modifications as reasonably and properly, within the scope of my contribution to the art.

I claim:

1. A method for manufacturing a semiconductor laser component having a laser-active semiconductor body with mirror layers on opposite side surfaces and a support plate fastened to one surface of the body, said method comprising the steps of providing the laser-active semiconductor body and the support plate, securing the support plate on the one surface of the laser-active semiconductor body and then after the step of securing applying the mirror layers on the opposite side surfaces of the laser-active semiconductor body.

2. A method according to claim 1, wherein the step of providing the support plate provides a support plate made of a material that comprises both a good thermal conductivity and a good electrical conductivity.

3. A method according to claim 2, wherein the step of providing the support plate provides a plate of a material having a coefficient of thermal expansion similar to the coefficient of thermal expansion of the semiconductor material of the semiconductor body.

4. A method according to claim 1, wherein the step of securing the support plate on the one surface of the semiconductor body includes positioning the support plate on the surface of the semiconductor body with side surfaces of the support plate terminating flush with the opposite side surfaces of the semiconductor body and then securing the plate to said body.

5. A method according to claim 1, wherein the support plate is made of a molybdenum.

6. A method according to claim 1, wherein the step of securing the support plate on the semiconductor body secures the plate with a hard solder.

7. A method according to claim 1, wherein the step of securing the support plate on the semiconductor body includes positioning the support plate with at least one surface terminating flush with an end surface of the semiconductor body which end surface is the surface to which the laser beam exits, and then securing the plate to said body.

8. A method according to claim 1, wherein the step of providing the support plate, provides a support plate having an upper surface having a dimension corresponding to the dimensions of the one surface of the semiconductor body.

9. A method according to claim 8, wherein the support plate is chosen so that at least one of the side surfaces slopes relative to the one surface.

10. A method according to claim 1, wherein the step of securing the support plate to the semiconductor body includes positioning at least one side surface of the support plate to lie flush with an end surface of the semiconductor body, and then securing the support plate in said position and said step of applying the mirror layers applies the mirror layer on said one end surface of the semiconductor body with at least a part of the mirror layer being applied on the one side surface of the support plate.

11. A method according to claim 1, wherein the step of providing the support plate provides a support plate having a coefficient of thermal expansion similar to that to the coefficient of the thermal expansion for the material of the semiconductor body.

12. A method according to claim 1, which further includes providing a contact on a surface of the semiconductor body opposite the support plate prior to the step of applying the mirror layers.

13. A method according to claim 12, which subsequent to the step of applying the mirror layers includes securing a heat sink on an exposed surface of the support plate.

14. A method according to claim 12, wherein the step of providing a contact including bonding a contact plate on said opposite surface.

15. A method according to claim 1, wherein the laser-active semiconductor body comprises a material selected from a group consisting of GaAs, AlGaAs and InGaAlAs and the support plate is made of molybdenum.

16. A method according to claim 1, wherein the support plate is chosen so that at least one side surface of the supporting plate slopes relative to the one surface.

17. A method according to claim 1, wherein one of the side surfaces of the semiconductor body is a beam exit surface, wherein the support plate has a sloping side surface relative to an attachment surface and the step of securing includes positioning the support plate with an edge between the attachment surface and the sloping side surface being flush with the beam exit surface of the semiconductor body.

18. A method according to claim 14, wherein both said step of securing the support plate and the step of bonding a contact plate are by laser soldering.

19. A method according to claim 1, wherein said step of securing the support plate is by laser soldering.

* * * * *